United States Patent
Ha et al.

(10) Patent No.: US 8,860,010 B2
(45) Date of Patent: Oct. 14, 2014

(54) ORGANIC LIGHT EMITTING DISPLAY

(75) Inventors: Jae-Heung Ha, Yongin (KR); Seok-Gyu Yoon, Yongin (KR); Kyu-Hwan Hwang, Yongin (KR); Young-Woo Song, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 210 days.

(21) Appl. No.: 13/176,293

(22) Filed: Jul. 5, 2011

(65) Prior Publication Data

US 2012/0074435 A1    Mar. 29, 2012

(30) Foreign Application Priority Data

Sep. 24, 2010  (KR) ........................ 10-2010-0092854

(51) Int. Cl.
*H01L 51/52*    (2006.01)
(52) U.S. Cl.
CPC ................................ *H01L 51/5203* (2013.01)
USPC ............................................. 257/40; 257/88
(58) Field of Classification Search
None
See application file for complete search history.

(56) References Cited

U.S. PATENT DOCUMENTS

| 7,514,862 | B2* | 4/2009 | Ryu | ........................ 313/504 |
| 2007/0075936 | A1* | 4/2007 | Kim | ........................ 345/76 |
| 2010/0019245 | A1* | 1/2010 | Yamazaki et al. | ........... 257/59 |
| 2010/0177269 | A1* | 7/2010 | Kimura | ................... 349/114 |

FOREIGN PATENT DOCUMENTS

| KR | 10-2008-0040511 A | 5/2008 |
| KR | 10-2008-0095521 A | 10/2008 |
| KR | 10-0892369 B1 | 4/2009 |
| KR | 10-0949339 B1 | 3/2010 |

* cited by examiner

*Primary Examiner* — Johannes P Mondt
(74) *Attorney, Agent, or Firm* — Knobbe Martens Olson & Bear LLP (57) ABSTRACT

An organic light emitting display is disclosed. In one embodiment, the display includes 1) a substrate, 2) a plurality of pixels formed on the substrate, wherein each of the pixels comprises at least one circuit region including i) a first light emission area, ii) a second light emission area iii) at least one transmission area transmitting external light, and iv) a pixel circuit unit and 3) a first pixel electrode formed in the first light emission area and electrically connected to the pixel circuit unit, wherein the first pixel electrode comprises a first transparent conductive layer and a reflective layer. The display may further include 1) a second pixel electrode formed in the second light emission area and electrically connected to the first pixel electrode, wherein the second pixel electrode comprises a second transparent conductive layer, 2) a first opposite electrode substantially directly below or above the first pixel electrode, 3) a second opposite electrode substantially directly below or above the second pixel electrode and 4) an organic emission layer formed between the first pixel electrode and the first opposite electrode and between the second pixel electrode and the second opposite electrode.

14 Claims, 10 Drawing Sheets

ORGANIC LIGHT EMITTING DISPLAY

CROSS-REFERENCE TO RELATED PATENT APPLICATION

This application claims the benefit of Korean Patent Application No. 10-2010-0092854, filed on Sep. 24, 2010, in the Korean Intellectual Property Office, the disclosure of which is incorporated herein in its entirety by reference.

BACKGROUND

1. Field

The described technology generally relates to an organic light emitting display, and more particularly, to a transparent organic light emitting display.

2. Description of the Related Technology

Organic light emitting displays generally have wide viewing angles, high contrast ratios, short response times, and reduced power consumption. The displays may be used across a variety of applications such as personal portable devices (e.g., MP3 players and mobile phones) or a large screen display (e.g., television sets). An organic light emitting display is self-emissive. Also, the weight and thickness of the organic display can be reduced since it does not require an additional light source unlike a liquid crystal display. Further, the device can be made transparent by using transparent thin film transistors and other transparent elements (e.g., transparent organic light emitting elements).

SUMMARY

One aspect is an organic light emitting display that is transparent by improving a light transmittance at a transmission region and may be formed as a dual-emission type.

Another aspect is a transparent organic light emitting display that prevents distortion of images by restraining scatter of transmitted light.

Another aspect is an organic light emitting display including: a substrate; a plurality of pixels formed on the substrate, and each comprising at least one circuit area including a first emission area and a second emission area emitting light, at least one transmission area transmitting external light, and a pixel circuit unit; a plurality of first pixel electrodes disposed on the first emission areas of the pixels, electrically connected to the pixel circuit units, and comprising transparent conductive layers and reflective layers; a plurality of second pixel electrodes disposed on the second emission areas, electrically connected to the first pixel electrodes, and comprising transparent conductive layers; a first opposite electrode facing the first pixel electrode; a second opposite electrode facing the second pixel electrode; and organic layers disposed between the first pixel electrode and the first opposite electrode and between the second pixel electrode and the second opposite electrode, and comprising emission layers.

At least a part of the second emission area may be disposed on the transmission area. The first pixel electrode and the second pixel electrode may be connected to each other. The transparent conductive layer may be formed of at least one metal oxide selected from the group consisting of indium tin oxide (ITO), indium zinc oxide (IZO), ZnO, and $In_2O_3$.

The second pixel electrode may further include a reflective layer that is formed to reflect or transmit the light. The reflective layer may include at least one metal material selected from the group consisting of Ag, Mg, Al, Pt, Pd, Au, Ni, Nd, Ir, Cr, Li, Ca, Yb, and an alloy thereof. The first opposite electrode and the second opposite electrode may be integrally formed with each other.

The first opposite electrode may be formed to transmit the light. The second opposite electrode may be formed to reflect the light. The first opposite electrode and the second opposite electrode may include at least one metal selected from the group consisting of Ag, Mg, Al, Pt, Pd, Au, Ni, Nd, Ir, Cr, Li, Ca, Yb, and an alloy thereof.

Another aspect is an organic light emitting display including: a substrate; a plurality of pixels formed on the substrate, and each comprising at least one circuit area including a first emission area and a second emission area emitting light, at least one transmission area transmitting external light, and a pixel circuit unit, wherein at least a part of the second emission area is disposed on the transmission area; a plurality of transmission windows formed in the at least one transmission area; a plurality of first pixel electrodes disposed on the first emission areas of the pixels, electrically connected to the pixel circuit units, and comprising transparent conductive layers and reflective layers; a plurality of second pixel electrodes disposed on the second emission areas, electrically connected to the first pixel electrodes, and comprising transparent conductive layers; a first opposite electrode facing the first pixel electrode; a second opposite electrode facing the second pixel electrode; and organic layers disposed between the first pixel electrode and the first opposite electrode and between the second pixel electrode and the second opposite electrode, and comprising emission layers.

The first pixel electrode and the second pixel electrode may be connected to each other. The transparent conductive layer may be formed of at least one metal oxide selected from the group consisting of indium tin oxide (ITO), indium zinc oxide (IZO), ZnO, and $In_2O_3$. The second pixel electrode may further include a reflective layer that is formed to reflect or transmit the light.

The reflective layer may include at least one metal material selected from the group consisting of Ag, Mg, Al, Pt, Pd, Au, Ni, Nd, Ir, Cr, Li, Ca, Yb, and an alloy thereof. The first opposite electrode and the second opposite electrode may be integrally formed with each other. The first opposite electrode may be formed to transmit the light. The second opposite electrode may be formed to reflect the light. The first opposite electrode and the second opposite electrode may include at least one metal selected from the group consisting of Ag, Mg, Al, Pt, Pd, Au, Ni, Nd, Ir, Cr, Li, Ca, Yb, and an alloy thereof.

Another aspect is an organic light emitting display comprising: a substrate; a plurality of pixels formed on the substrate, wherein each of the pixels comprises at least one circuit region including i) a first light emission area, ii) a second light emission area iii) at least one transmission area transmitting external light, and iv) a pixel circuit unit; a first pixel electrode formed in the first light emission area and electrically connected to the pixel circuit unit, wherein the first pixel electrode comprises a first transparent conductive layer and a reflective layer; a second pixel electrode formed in the second light emission area and electrically connected to the first pixel electrode, wherein the second pixel electrode comprises a second transparent conductive layer; a first opposite electrode substantially directly below or above the first pixel electrode; a second opposite electrode substantially directly below or above the second pixel electrode; and an organic emission layer formed between the first pixel electrode and the first opposite electrode and between the second pixel electrode and the second opposite electrode.

In the above display, at least part of the second light emission area overlaps with the transmission area. In the above display, the first and second pixel electrodes are connected to each other and formed on the organic layer. In the above display, at least one of the first and second transparent conductive layers is formed of at least one metal oxide selected from the group consisting of indium tin oxide (ITO), indium zinc oxide (IZO), ZnO, and $In_2O_3$. In the above display, the second pixel electrode is partially transmissive and partially reflective.

In the above display, the reflective layer of the first pixel electrode comprises at least one metal material selected from the group consisting of Ag, Mg, Al, Pt, Pd, Au, Ni, Nd, Ir, Cr, Li, Ca, Yb, and an alloy thereof. In the above display, the first and second opposite electrodes are integrally formed with each other. In the above display, the first opposite electrode is at least partially transmissive. In the above display, the second opposite electrode is at least partially reflective. In the above display, at least one of the first and second opposite electrodes comprises at least one metal selected from the group consisting of Ag, Mg, Al, Pt, Pd, Au, Ni, Nd, Ir, Cr, Li, Ca, Yb, and an alloy thereof.

Another aspect is an organic light emitting display comprising: a substrate; a plurality of pixels formed on the substrate, wherein each of the pixels comprises at least one circuit region including i) a first light emission area, ii) a second light emission area, iii) at least one light transmission area, and iv) a pixel circuit unit, and wherein at least part of the second emission area overlaps with the light transmission area; at least one transmission window formed in the light transmission area; a first pixel electrode formed on the first light emission area and electrically connected to the pixel circuit unit, wherein the first pixel electrode is at least partially reflective; a second pixel electrode formed on the second light emission area and electrically connected to the first pixel electrode, wherein the second pixel electrode is at least partially transmissive; a first opposite electrode substantially directly below or above the first pixel electrode; a second opposite electrode substantially directly below or above the second pixel electrode; and an organic emission layer formed between the first pixel electrode and the first opposite electrode and between the second pixel electrode and the second opposite electrode.

In the above display, the first and second pixel electrodes contact each other and formed on the organic layer. In the above display, the first pixel electrode is thicker than the second pixel electrode. In the above display, the second pixel electrode is formed of a partially transmissive material and a partially reflective material. In the above display, the pixel circuit unit is formed substantially directly below or above the first pixel electrode and is not formed in the light transmission area.

In the above display, the second pixel electrode is closer to the light transmission area than the first pixel electrode. The above display further comprises at least one insulating layer contacting the pixel circuit unit, wherein the at least one transmission window contacts the insulating layer. In the above display, the at least one transmission window comprises a first transmission window formed on a pixel defining layer. In the above display, the at least one transmission window comprises a second transmission window formed on a passivation layer and formed between the first and second pixel electrodes.

Another aspect is an organic light emitting display comprising: a substrate; a plurality of pixels formed on the substrate, wherein each of the pixels comprises i) a first light emission area, ii) a second light emission area, iii) a light transmission area and iv) at least one circuit element which is formed substantially directly below or above the first light emission area and is not formed in the light transmission area, and wherein the second light emission area at least partially overlaps with the light transmission area; a first pixel electrode formed on the first light emission area and electrically connected to the circuit element, wherein the first pixel electrode is at least partially reflective; a second pixel electrode formed on the second light emission area and electrically connected to the first pixel electrode, wherein the second pixel electrode is at least partially transmissive; and an organic light emitting diode contacting and formed over the first and second pixel electrodes.

DETAILED DESCRIPTION

A transparent display, when in an off state, generally allows an object, positioned on an opposite side of a user with respect to the display, to be transmitted to the user. This transmission may occur not only through organic light emitting diodes but also through spaces between patterns of thin film transistors and various wires. However, the light transmittance of a transparent organic light-emitting display is not very high, because the light transmittance of display components such as transistors and various wires are low, and there is little space between the wires.

In addition, a distorted image may be transmitted to the user due to the patterns. This is because gaps between the patterns are only a few nanometers, a dimension which is close to the wavelengths of visible light, and thus, light scatters while passing through the gaps.

Meanwhile, organic light emitting displays may be realized as a dual-emission type display when compared with LCDs. However, in the dual-emission type display, a reflective anode may not be used, and thus, an optical resonant effect may not be obtained. Accordingly, greater light extracting efficiency may not be obtained.

Figure 1:
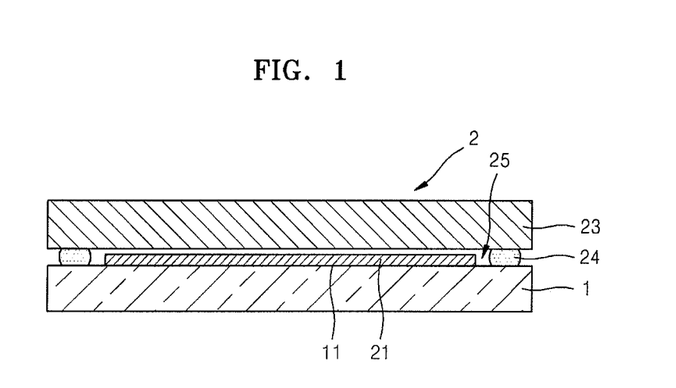
FIG. 1 is a cross-sectional view of an organic light emitting display according to an embodiment.

Hereinafter, embodiments will be described in detail with reference to accompanying drawings. FIG. 1 is a cross-sectional view of an organic light emitting display 1 according to an embodiment.

Referring to FIG. 1, the organic light emitting display 2 includes an organic emission unit 21 formed on a first surface 11 of a substrate 1, and a sealing substrate 23 for sealing the organic emission unit 21.

The sealing substrate 23 may be formed at least partially of a transparent material so that images emitted from the unit 21 may be displayed therethrough, and substantially prevents external air and moisture from infiltrating into the organic emission unit 21.

Edges of the substrate 1 and the sealing substrate 23 are coupled to each other by a sealing material (e.g., frit) 24 so as to substantially seal the space 25 between the substrate 1 and the sealing substrate 23. An absorbent or a filler may be provided in the space 25.

Figure 2:
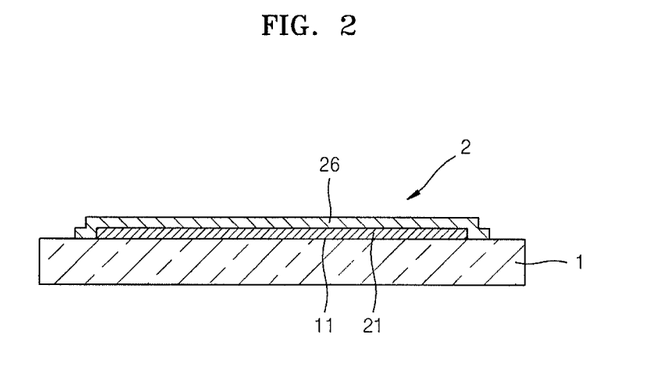
FIG. 2 is a cross-sectional view of an organic light emitting display according to another embodiment.

As shown in FIG. 2, instead of using the sealing substrate 23, a thin sealing film 26 may be formed on the organic emission unit 21 so as to protect the organic element 21 from external impurities such as air or moisture. The sealing film 26 may include an alternately stacked structure of i) an inorganic film formed at least partially of, for example, silicon oxide or silicon nitride and ii) an organic film formed at least partially of, for example, epoxy or polyimide. However, the sealing film 26 may have other sealing structure including a transparent film.

Figure 3:
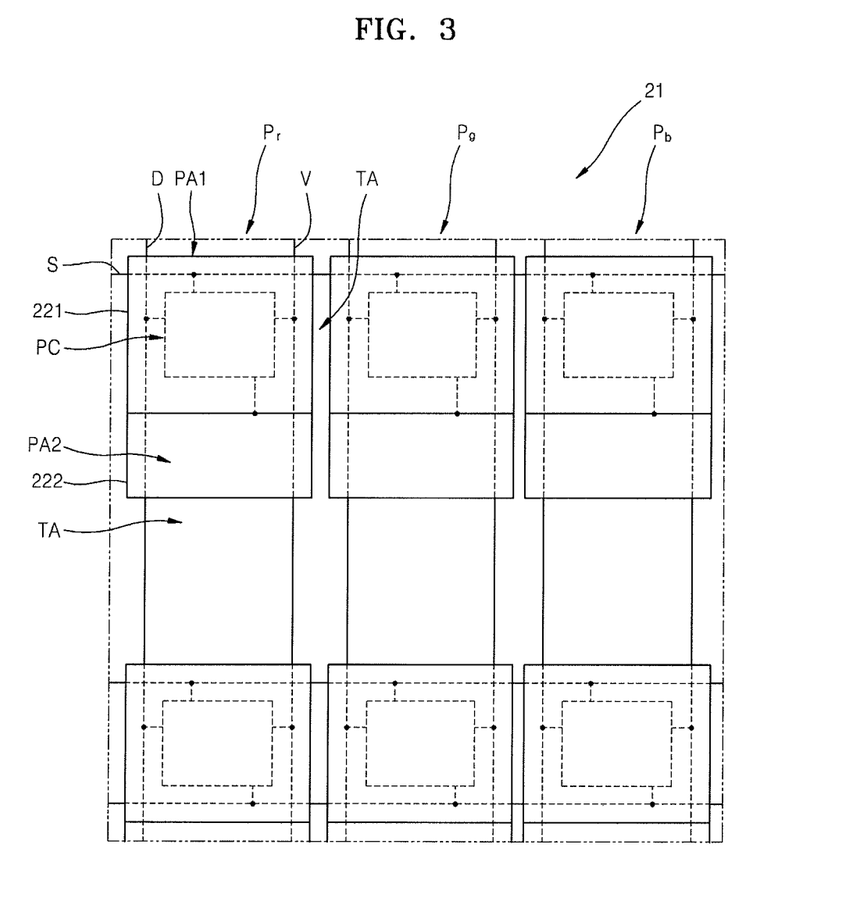
FIG. 3 is a schematic diagram of an organic emission unit shown in FIG. 1 or FIG. 2.
Figure 4:
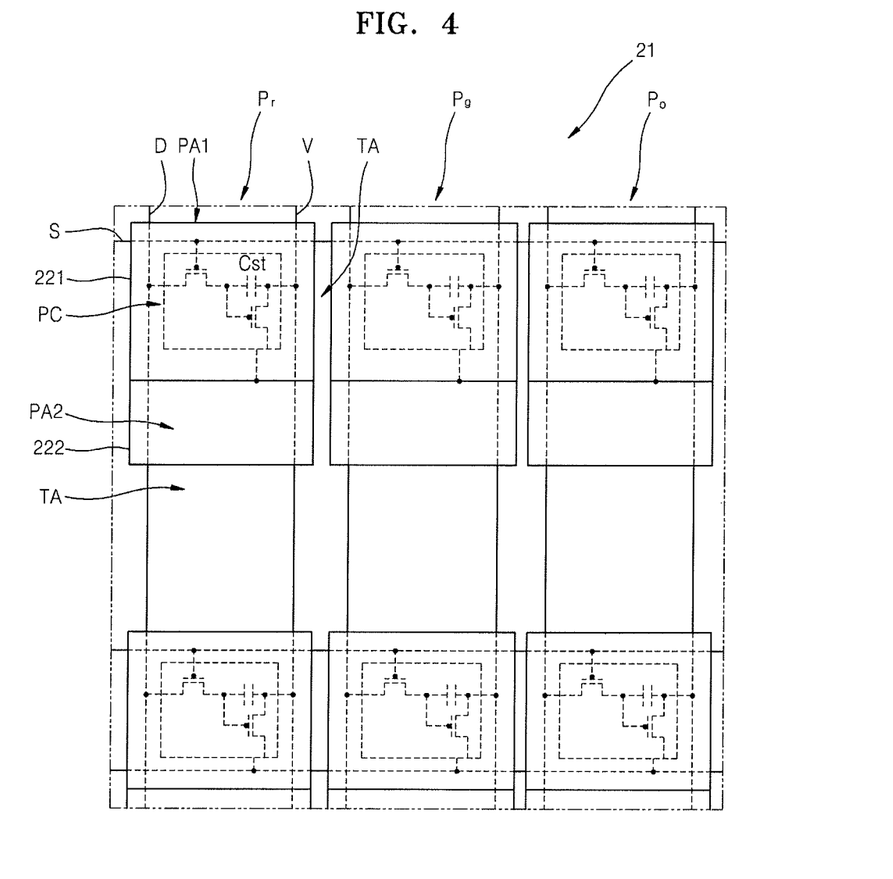
FIG. 4 is a schematic diagram of the organic emission unit illustrating a pixel circuit unit of FIG. 3 in detail.

FIGS. 3 and 4 are plan views showing a red pixel $P_r$, a green pixel $P_g$, or a blue pixel $P_b$ that are adjacent to each other in the organic emission unit 21. FIG. 4 is a detailed schematic diagram showing a pixel circuit unit PC of FIG. 3.

Each of the red, green, and blue pixels $P_r$, $P_g$, and $P_b$ has a first emission area PA1, a second emission area PA2, and a transmission area TA. The transmission area TA may be separately provided in each of the pixels $P_r$, $P_g$, and $P_b$, or may be shared by the pixels $P_r$, $P_g$, and $P_b$.

Referring to FIGS. 1 through 4, the organic emission unit 21 is formed on the substrate 1 that is divided into i) the transmission areas TA, and ii) the plurality of first emission areas PA1 that are separated by the transmission areas TA (see FIGS. 3 and 4). The plurality of second emission areas PA2 that are respectively adjacent to the plurality of first emission areas PA1 are located on at least part of the transmission areas TA so that the second emission areas PA2 both transmit the external light into the display and emit the light toward the environment.

As shown in FIG. 4, each of the first emission areas PA1 includes a pixel circuit unit PC, and a plurality of conductive lines such as a scan line S, a data line D, and a Vdd line V (driving voltage line) are electrically connected to the pixel circuit unit PC. Although not shown in FIG. 4, various additional conductive lines may be formed according to a structure of the pixel circuit unit PC. In one embodiment, at least some of the pixel circuit unit PC and the above conductive lines are not formed directly below or above the second emission areas PA2.

The pixel circuit unit PC includes i) a first thin film transistor TR1 electrically connected to the scan line S and the data line D, ii) a second thin film transistor TR2 electrically connected to the first thin film transistor TR1 and the Vdd line V, and iii) a capacitor Cst electrically connected to the first and second thin film transistors TR1 and TR2. In one embodiment, the first thin film transistor TR1 is a switching transistor and the second thin film transistor TR2 is a driving transistor. The second thin film transistor TR2 is electrically connected to a first pixel electrode 221. In one embodiment, as shown in FIG. 4, the first and second thin film transistors TR1 and TR2 are P-type transistors. In another embodiment, at least one of the first and second thin film transistors TR1 and TR2 is an N-type transistor. The number of thin film transistors and the number of the capacitor are not limited to the above example, and two or more thin film transistors and one or more capacitors may be formed according to the configuration of the pixel circuit unit PC.

In one embodiment, as shown in FIGS. 3 and 4, the scan lines S, the data lines D, and the Vdd lines V at least partially overlap with the first pixel electrode 221. In another embodiment, at least one of the conductive lines (e.g., S, D, V) may at least partially overlap with the first pixel electrode 221. Depending on the embodiment, all of the conductive lines may be disposed next to the first pixel electrode 221.

In one embodiment, each of the first emission areas PA1 is a top emission type, a light extracting efficiency of which is excellent, in each of sub-pixels, which will be described later. In addition, since the pixel circuit unit PC is located in the top emission area, the user may see the external portion through the transmission area TA including the second emission area PA2. That is, since the conductive patterns of the pixel circuit unit PC, which is generally the largest element for reducing the light transmittance of the transmission area TA, are not located on the transmission area TA, the light transmittance of the transmission area TA may be improved.

As described above, according to one embodiment, the organic emission unit 21 displaying the images is divided into the first emission area PA1 and the transmission area TA. Further, most conductive patterns that reduce the entire light transmittance of the display are disposed on the first emission area PA1 in order to increase the light transmittance of the transmission area TA. Thus, a light transmittance of the entire image displaying area (the organic emission unit 21 of FIG. 1 or FIG. 2) may be significantly improved compared to a typical transparent display where conductive patterns are formed in both light emission areas and light transmission area.

Moreover, since the pixel circuit unit PC is disposed to substantially overlap with the first emission area PA1, distortion of external images, which is generated because the external light is scattered due to the patterns of the devices in the pixel circuit unit PC, may be substantially prevented.

Although at least one of the conductive lines (e.g., S, D, V) may be disposed to cross the transmission area TA located between two adjacent first emission areas PA1, the conductive lines are very thin, and thus, do not affect the entire light transmittance of the organic emission unit 21 and are hardly seen by the user. In addition, even if the user may not see the external image as much as the region blocked by the first emission areas PA1, the first emission areas PA1 may be like a plurality of points arranged substantially regularly on the entire display area. Thus, the user can easily see the external images.

The first pixel electrode 221 is disposed on the first emission area PA1, and the pixel circuit unit PC substantially overlaps with the first pixel electrode 221 so as to be substantially blocked by the first pixel electrode 221. In addition, at least one of the conductive lines may be disposed to cross the first pixel electrode 221. Since the conductive lines may less affect the light transmittance than the pixel circuit unit PC does, the conductive lines may be disposed adjacent to the first pixel electrode 221 according to the design condition. In one embodiment, the first pixel electrode 221 includes a reflective layer formed at least partially of a conductive metal reflecting light as will be described later, and thus, the first pixel electrode 221 substantially blocks the pixel circuit unit PC and prevents the external images from being distorted by the pixel circuit unit PC on the first emission area PA1.

A second pixel electrode 222 is further disposed on the transmission area TA to form the second emission area PA2.

In one embodiment, the second pixel electrode 222 is formed at least partially of a metal oxide transmitting the light so that the second emission area PA2 becomes a bottom emission type.

Figure 5:
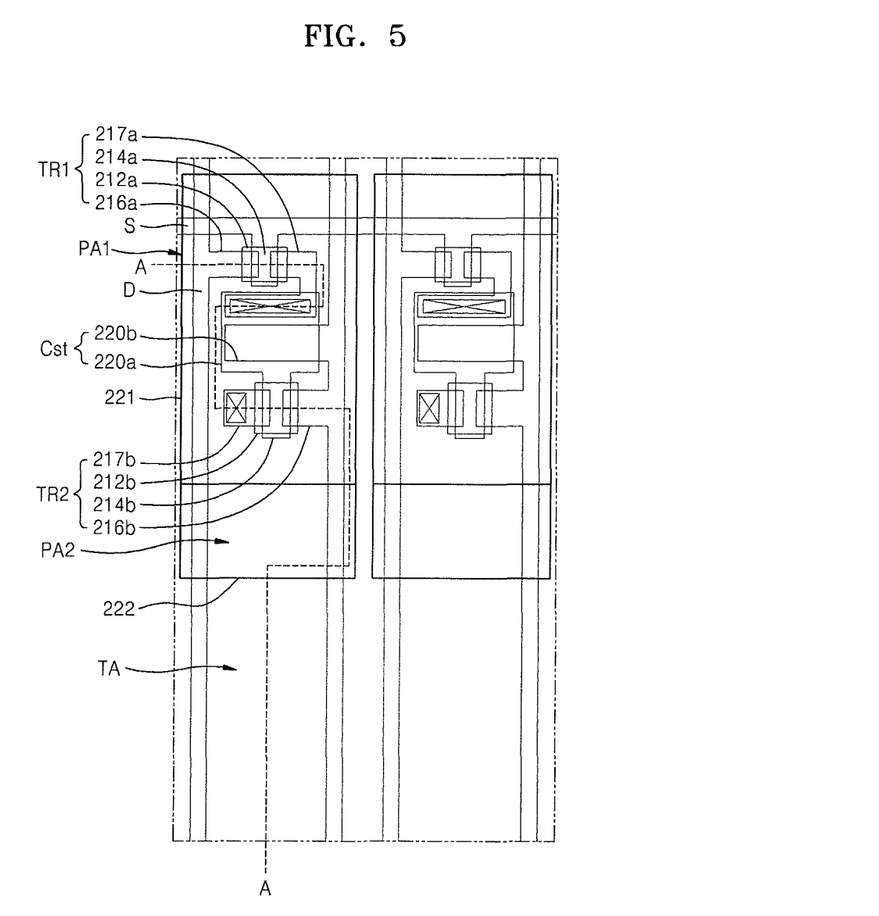
FIG. 5 is a detailed plan view of the organic emission unit of FIG. 4.
Figure 6:
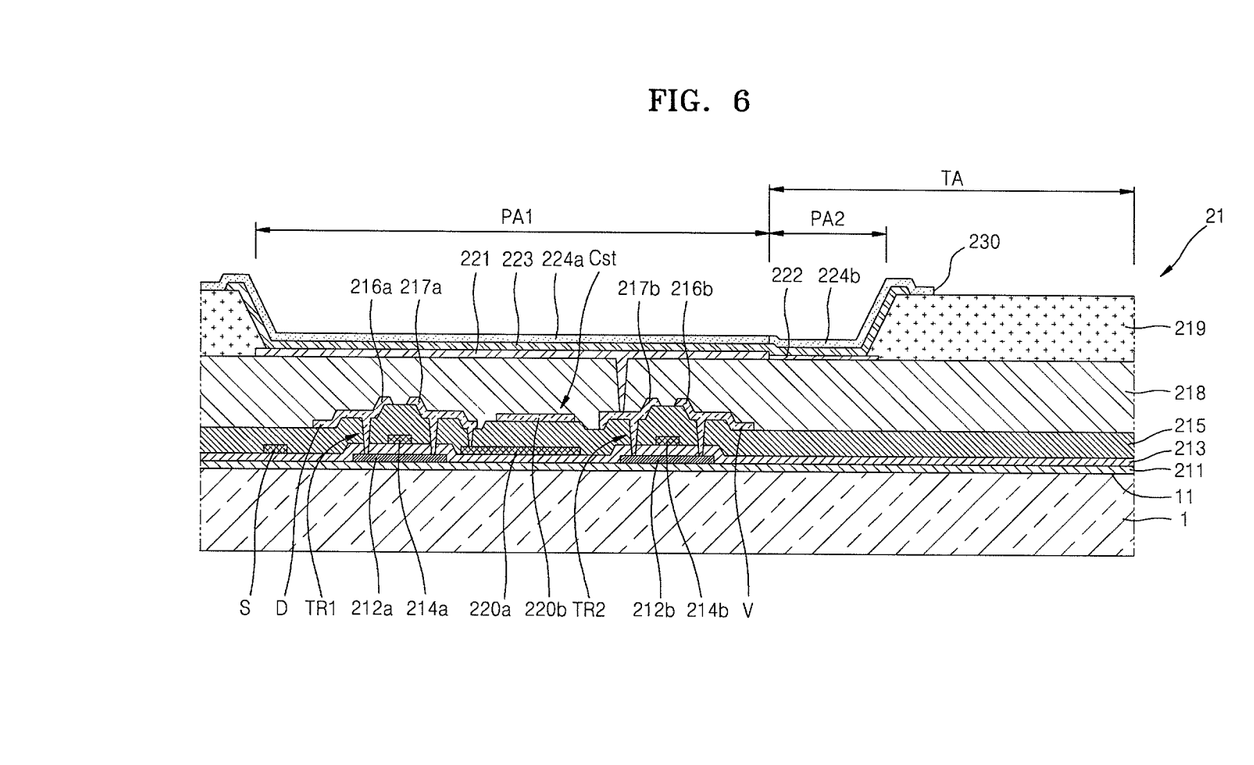
FIG. 6 is a cross-sectional view of the organic emission unit taken along line A-A of FIG. 5.

FIG. 5 is a plan view of the organic emission unit 21 showing the pixel circuit unit PC of FIG. 4 in more detail. FIG. 6 is a cross-sectional view of the pixel circuit unit PC taken along line A-A of FIG. 5.

In one embodiment, as illustrated in FIGS. 5 and 6, a buffer layer 211 is formed on a first surface 11 of the substrate 1, and the first thin film transistor TR1, the capacitor Cst, and the second thin film transistor TR2 are formed on the buffer layer 211.

First, a first semiconductor active layer 212a and a second semiconductor active layer 212b are formed on the buffer layer 211.

The buffer layer 211 may be formed of various materials so as to prevent infiltration of impurities and to planarize a surface of the substrate 1. For example, the buffer layer 211 may be formed at least partially of an inorganic material such as silicon oxide, silicon nitride, silicon oxynitride, aluminum oxide, aluminum nitride, titanium oxide, or titanium nitride, an organic material such as polyimide, polyester, or acryl, or a stacked substance thereof. Depending on the embodiment, the buffer layer 211 may be omitted.

The first and second semiconductor active layers 212a and 212b may be at least partially formed of polycrystalline silicon. Further, the first and second semiconductor active layers 212a and 212b may be at least partially formed of an oxide semiconductor. For example, the semiconductor active layer 212 may be a G-I-Z-O layer $[(In_2O_3)a(Ga_2O_3)b(ZnO)c$ layer] (a, b, c are real numbers satisfying conditions of $a \geq 0$, $b \geq 0$, $c > 0$).

A gate insulating layer 213 is formed on the buffer layer 211 so as to cover the first and second semiconductor active layers 212a and 212b, and a first gate electrode 214a and a second gate electrode 214b are formed on the gate insulating layer 213.

An interlayer dielectric 215 is formed on the gate insulating layer 213 so as to cover the first and second gate electrodes 214a and 214b. A first source electrode 216a and a first drain electrode 217a, and a second source electrode 216b and a second drain electrode 217b are formed on the interlayer dielectric 215 so as to contact the first and second semiconductor active layers 212a and 212b through contact holes.

In FIG. 6, the scan line S may be formed substantially simultaneously when the first and second gate electrodes 214a and 214b are formed. In one embodiment, the data line D is formed substantially simultaneously when the first source electrode 216a is formed so as to be electrically connected to the first source electrode 216a, and the Vdd line V may be formed substantially simultaneously when the second source electrode 216b is formed so as to be electrically connected to the second source electrode 216b.

In one embodiment, a lower electrode 220a of the capacitor Cst is formed substantially simultaneously when the first and second gate electrodes 214a and 214b, and an upper electrode 220b of the capacitor Cst is formed substantially simultaneously when the first drain electrode 217a is formed.

The above structure is not considered limiting. For example, the first and second thin film transistors TR1 and TR2 are formed as top-gate structures; however, they may be formed as bottom-gate structures, in which the first and second gate electrodes 214a and 214b are formed respectively under the first and second semiconductor active layers 212a and 212b. Other structures of the thin film transistor may be also used.

A passivation layer 218 is formed to cover the first thin film transistor TR1, the capacitor Cst, and the second thin film transistor TR2. The passivation layer 218 may be a single insulating layer or a plurality of insulating layers having a substantially flat upper surface. The passivation layer 218 may be formed at least partially of a transparent inorganic insulating material and/or an organic insulating material.

As shown in FIGS. 5 and 6, the first pixel electrode 221 is formed on the passivation layer 218 to substantially block the first thin film transistor TR1, the capacitor Cst, and the second thin film transistor TR2. The first pixel electrode 221 is electrically connected to the second drain electrode 217b of the second thin film transistor TR2 through a via hole formed in the passivation layer 218.

In addition, a second pixel electrode 222 is formed on the passivation layer 218 to be adjacent to and/or to contact the first pixel electrode 221. The first and second pixel electrodes 221 and 222 may be electrically connected to each other, and the connected body of the first and second pixel electrodes 221 and 222 may be formed as an island that is independently formed on each of the pixels, as shown in FIG. 5.

A pixel defining layer 219 covers edge portions of the first pixel electrode 221 and the second pixel electrode 222, and an organic layer 223 is formed on the first pixel electrode. In addition, a first opposite electrode 224a and a second opposite electrode 224b are formed to cover the organic layer 223. Therefore, the first opposite electrode 224a is formed on the first emission area PA1 and the second opposite electrode 224b is formed on the second emission area PA2. In one embodiment, at least part of the second opposite electrode 224b is formed on the transmission area TA.

The organic layer 223 may be formed at least partially of a low-molecular weight organic material or a high-molecular weight organic material. When including a low-molecular weight organic layer, the organic layer 223 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenylbenzidine (NPB), tris-8-hydroxyquinoline aluminum (Alq3), and the like. The low-molecular weight organic layer may be formed by vacuum deposition. Here, the EML is independently formed in each of the red, green, and blue pixels $P_r$, $P_g$, and $P_b$, and the HIL, the HTL, the ETL, and the EIL are common layers applied commonly to the red, green, and blue pixels $P_r$, $P_g$, and $P_b$.

The first and second pixel electrodes 221 and 22 may function as anodes, and the first and second opposite electrodes 224a and 224b may function as cathodes. Alternatively, the first and second pixel electrodes 221 and 222 may function as cathodes, and the first and second opposite electrodes 224a and 224b may function as anodes.

The first pixel electrode 221 is formed in each of the pixels in a size substantially corresponding to the first emission area PA1. In addition, the second pixel electrode 222 is formed in each of the pixels in a size substantially corresponding to the second emission area PA2.

The first and second opposite electrodes 224a and 224b may be applied by a common voltage with respect to entire pixels in the organic emission unit 21.

At least one of the passivation layer 218, the gate insulating layer 213, the interlayer dielectric 215, and the pixel defining layer 219 may be formed at least partially of a transparent insulating material. Here, the light transmittance of the substrate 1 may be less than or equal to the entire light transmittance of the above insulating layers (213, 215, 218 and 219).

Figure 7A:
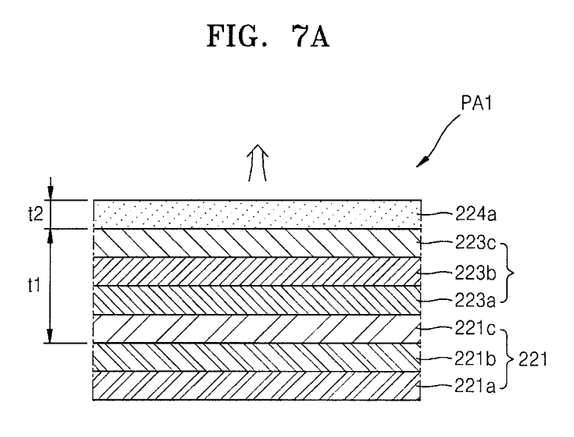
FIG. 7A is a cross-sectional view showing an example of a first emission area (PA1) of FIG. 6.
Figure 7B:
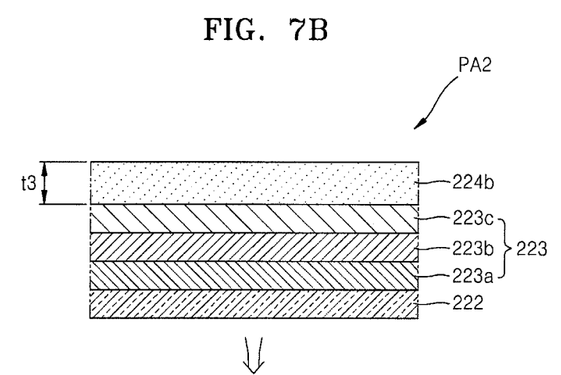
FIG. 7B is a cross-sectional view showing an example of a second emission area (PA2) of FIG. 6.

FIG. 7A is a detailed schematic cross-sectional view of the first emission area PA1, and FIG. 7B is a detailed schematic cross-sectional view of the second emission area PA2.

The first pixel electrode 221 may be at least partially reflective, and the first opposite electrode 224a may be at least partially transmissive and at least partially reflective. In this embodiment, the first emission area PA1 is a top emission type which displays images toward the first opposite electrode 224a.

In one embodiment, when the first pixel electrode 221 is reflective, the pixel circuit unit PC disposed under the first pixel electrode 221 is blocked by the first pixel electrode 221. Accordingly, as shown in FIG. 6, the user may not see patterns of the first thin film transistor TR1, the capacitor Cst, and the second thin film transistor TR2 under the first pixel electrode 221 from an upper outer portion of the first opposite electrode 224a.

In this embodiment, since the first pixel electrode 221 is the reflective electrode, the light is only emitted toward the observer (user), and thus, loss of light to the opposite side of the observer may be reduced. In addition, since the first pixel electrode 221 blocks the various patterns of the pixel circuit as described above, the user may see substantially clear transmission images.

The second pixel electrode 222 may be at least partially transparent and the second opposite electrode 224b may be at least partially reflective. In this embodiment, the second emission area PA2 is a bottom emission type which displays images toward the second pixel electrode 222.

The second pixel electrode 222 may be formed substantially simultaneously when the first pixel electrode 221 is formed. For example, the transparent metal oxide layer of the first pixel electrode 221 except for the reflective layer may be patterned to extend to the second pixel electrode 222.

The first pixel electrode 221 may include a first transparent conductive layer 221a, a reflective layer 221b, and a second transparent conductive layer 221c. The first and second transparent conductive layers 221a and 221c may be formed at least partially of indium tin oxide (ITO), indium zinc oxide (IZO), ZnO, or $In_2O_3$ having a high work function. The reflective layer 221b may be formed at least partially of Ag, Mg, Al, Pt, Pd, Au, Ni, Nd, Ir, Cr, Li, Ca, Yb, or a compound thereof.

The organic layer 223 including a first functional layer 223a, an emission layer 223b, and a second functional layer 223c is formed on the first pixel electrode 221, and the first opposite electrode 224a is formed on the organic layer 223.

The first functional layer 223a may include the HIL and the HTL, and the second functional layer 223c may include the EIL and the ETL.

The first opposite electrode 224a may be formed at least partially of metal having a low work function, for example, Ag, Mg, Al, Pt, Pd, Au, Ni, Nd, Ir, Cr, Li, Ca, Yb, or an alloy thereof. The first opposite electrode 224a may be formed as a thin film so as to increase the light transmittance, for example, the first opposite electrode 224a may be formed to a thickness t2 of about 100 Å to about 300 Å.

At this time, the distance t1 between a surface of the reflective layer 221b and the first opposite electrode 224a may be adjusted to generate an optical resonance with respect to the wavelength of the light emitted from the emission layer 223b. Therefore, the distance t1 may vary depending on the pixels, that is, red, green, and blue pixels. In order to adjust the distance t1 for generating the optical resonance, the first functional layer 223a and/or the second functional layer 223c may further include an auxiliary layer for varying the thickness of the organic layer according to the color of the pixel.

The first emission area PA1 having the above structure is the top emission type area for displaying images toward the opposite electrode 224, and the light extracting efficiency may be maximized by adjusting the distance t1 for generating the optical resonance.

In one embodiment, the second pixel electrode 222 is formed at least partially of a transparent conductive material without including a reflective layer, as described above. Therefore, at least one of the first and second transparent conductive layers 221a and 221c of the first pixel electrode 221 may extend to form the second pixel electrode 222.

The organic layer 223 including the first functional layer 223a, the emission layer 223b, and the second functional layer 223c is formed on the second pixel electrode 222, and the second opposite electrode 224b is formed on the organic layer 223.

In the second emission area PA2, since there is no reflective layer in the second pixel electrode 222, there is no need to adjust the optical resonant distance. In addition, since the second emission area PA2 is the bottom emission type which displays images toward the second pixel electrode 222, and the thickness t3 of the second opposite electrode 224b may be greater than the thickness t2 of the first opposite electrode 224a. Accordingly, the second opposite electrode 224b may reflect the light emitted from the emission layer 223b more than the first opposite electrode 224a does. That is, since the thickness t3 of the second opposite electrode 224b is greater than the thickness t2 of the first opposite electrode 224a, the light reflectivity of the second opposite electrode 224b is greater than that of the first opposite electrode 224a.

However, the second opposite electrode 224b may be formed to transmit the light to a predetermined extent, and may be formed not to be excessively thick.

In addition, if the first and second opposite electrodes 224a and 224b are formed of a transparent material having a work function of cathode, the first and second opposite electrodes 224a and 224b may be formed to have substantially the same thickness as each other. In this case, the first opposite electrode 224a further includes a thin semi-transmission metal layer in order to improve the resonant effect.

In one embodiment, the second opposite electrode 224b is formed on only part of the transmission area TA as shown in FIGS. 5 and 6, and thus, the user may see the external images through the transmission area TA without any obstacle.

In one embodiment, the second emission area PA2 is formed on only part of the transmission area TA, and accordingly, the external light transmittance of the transmission area TA does not degrade much.

In addition, as shown in FIG. 6, a first transmission window 230 is formed in the second opposite electrode 224b. The first transmission window 230 may be a hole formed in the second opposite window 224b. In addition, since the first transmission window 230 is located on the transmission area TA, degradation of the light transmittance of the transmission area TA may be minimized or substantially prevented even when the second opposite electrode 224b that is thicker than the first opposite electrode 224a is located on the transmission area TA.

Furthermore, the user may see clear images through the first emission area TA1, and may see external images transmitted through the transmission area TA. In addition, a person located opposite to the user may see the images through the second emission area PA2, although image quality may be lower than the images displayed through the first emission area PA1. Accordingly, the organic light emitting display may realize a dual-emission display and a transparent display, at the same time.

Figure 8:
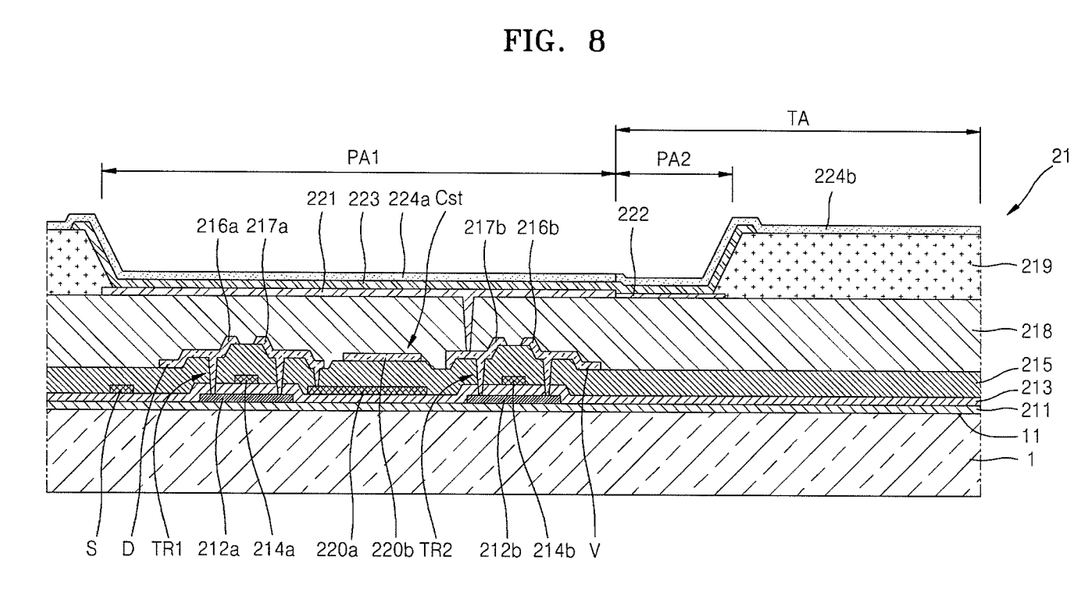
FIG. 8 is a cross-sectional view of an organic emission unit according to another example.

As described above, when the second opposite electrode 224b is formed of the transparent material having the work function of the cathode, there is no need to form an additional transmission window in the second opposite electrode 224b as shown in FIG. 8.

In one embodiment, in order to improve the light transmittance of the transmission area TA and to substantially prevent generation of optical interference caused due to the multi-transparent insulating layers in the transmission area TA and degradation of color purity and color change caused by the optical interference, a second transmission window 231 (FIG. 9) is formed in some insulating layers among the insulating layers corresponding to the transmission area TA.

In the present embodiment, in order to improve the external light transmittance of the transmission area TA, the area of the transmission area TA is increased, or the light transmittance of the material forming the transmission area TA is increased. However, there is a limitation in increasing the area of the transmission area TA due to the pixel circuit unit PC. In addition, there is a limitation in increasing the light transmittance of the material forming the transmission area due to difficulty in developing the materials.

Figure 9:
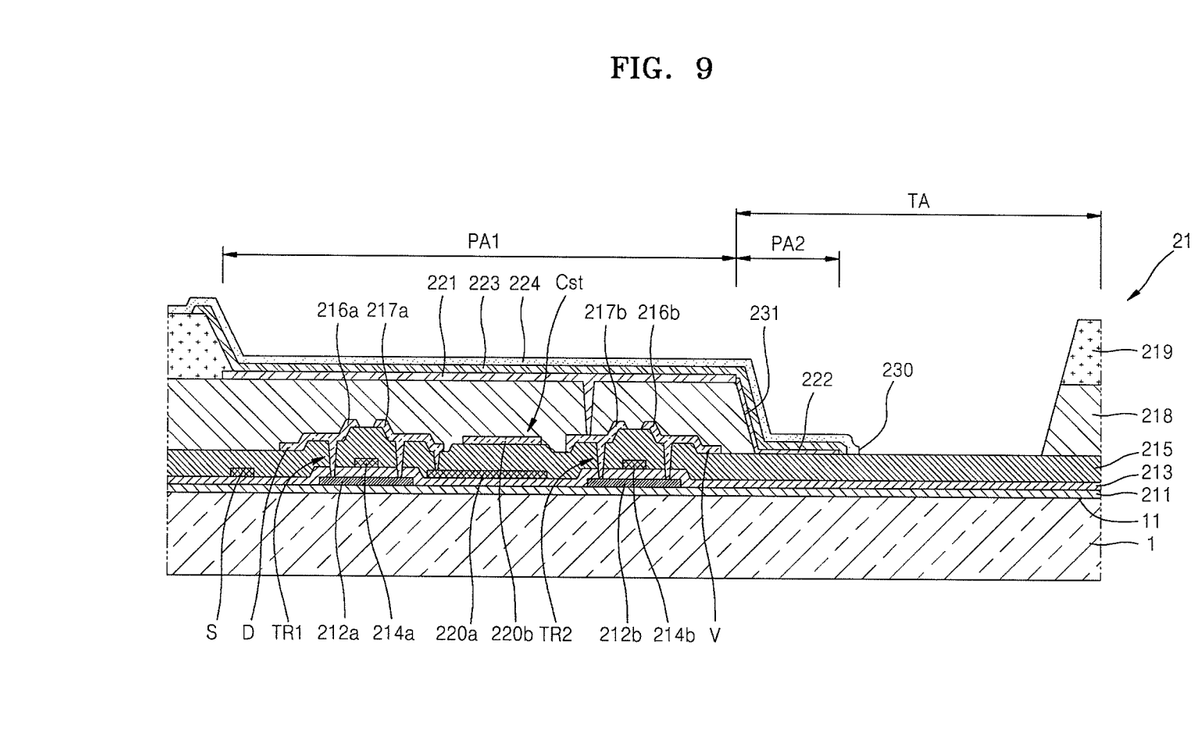
FIG. 9 is a cross-sectional view of an organic emission unit according to another example.

In one embodiment, the second transmission window 231 is formed in at least some of the insulating layers located on the portions corresponding to the transmission area TA.

In FIG. 9, the second transmission window 231 is formed in the passivation layer 218 that covers the pixel circuit unit PC. In one embodiment, as shown in FIG. 9, the second transmission window 231 is formed in the passivation layer 218. However, holes connecting to the second transmission window 231 may be further formed in at least one of the interlayer dielectric 215, the gate insulating layer 213, and the buffer layer 211 so as to improve the light transmittance through the second transmission window 231. The second transmission window 231 is formed as large as possible within a range of not interfering with the scan lines S, the data lines D, and the Vdd lines V.

In addition, the second transmission window 231 may be greater than the first transmission window 230 formed on the second opposite electrode 224b so as to improve the light transmittance of the transmission area TA.

Here, at least part of the second pixel electrode 222 may be disposed to extend to and/or contact the second transmission window 231.

Figure 10A:
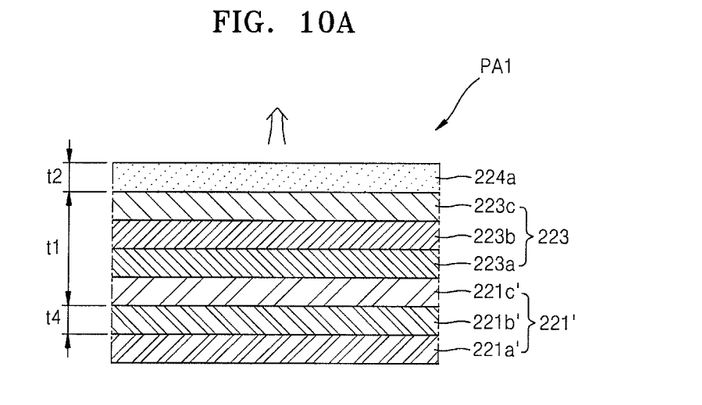
FIG. 10A is a cross-sectional view of a first emission area (PA1) of FIG. 9.
Figure 10B:
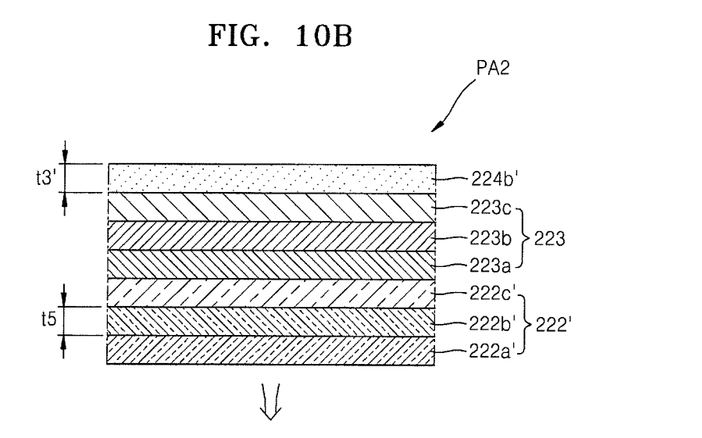
FIG. 10B is a cross-sectional view of a second emission area (PA2) of FIG. 9.

FIG. 10A is a schematic cross-sectional view of a first emission area PA1 according to another embodiment, and FIG. 10B is a schematic cross-sectional view of a second emission area PA2 according to another embodiment.

According to the present embodiment, a first pixel electrode 221' and a second pixel electrode 222' may respectively include reflective layers 221b' and 222b', third transparent conductive layers 221a' and 222a', and fourth transparent conductive layers 221c' and 222c'.

In one embodiment, the thickness t4 of the reflective layer 221b' in the first pixel electrode 221' and the thickness t5 of the reflective layer 222b' in the second pixel electrode 222' are substantially the same as each other, and at this time, the thickness t4 and t5 may be less than the thickness of the reflective layer 221b shown in FIG. 7A according to the previous embodiment. The thickness t4 of the reflective layer 221b' in the first pixel electrode 221' and the thickness t5 of the reflective layer 222b' may be about 100 Å to about 300 Å.

The first opposite electrode 224a and a second opposite electrode 224b' may be half-transmission and half-reflective electrodes. In one embodiment, the thickness t2 of the first opposite electrode 224a and the thickness t3' of the second opposite electrode 224b' are substantially the same as each other, that is, about 100 Å to about 300 Å.

According to the present embodiment, both of the first and second emission areas PA1 and PA2 are formed as the top-emission type; however, the thin reflective layers 221b' and 222b' are formed in the first and second pixel electrodes 221' and 222' so that the first and second emission areas PA1 and PA2 substantially perform as the dual-emission type.

Here, as shown in FIGS. 3 and 4, the pixel circuit unit PC is located on the first emission area PA1, and thus, less light is emitted as the bottom emission and more light is emitted as the top emission among the light emitted from the emission layer 223b.

Since the second emission area PA2 is located on the transmission area TA, the images may be displayed on both surfaces.

The first and second transmission windows 230 and 231 illustrated in FIGS. 6 and 9 may be applied to the present embodiment.

Figure 11:
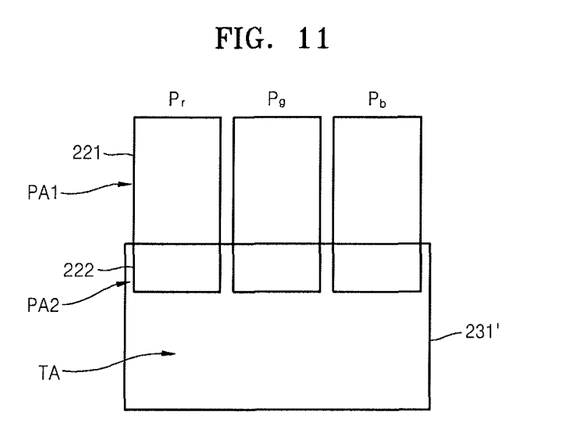
FIG. 11 is a plan view of an organic emission unit according to another example.

FIG. 11 is a plan view of an organic emission unit according to another embodiment, in which one second transmission window 231' is formed throughout the red, green, and blue pixels $P_r$, $P_g$, and $P_b$. Although not shown in FIG. 11, the first transmission window may be formed in the second opposite electrode.

In this case, the area of the transmission window 231' increases in one pixel including the red, green, and blue pixels $P_r$, $P_g$, and $P_b$, and thus, the light transmittance of the organic emission unit 21 may be increased.

The structures illustrated in FIGS. 3 through 10b may be applied to the organic emission unit of FIG. 11 according to the present embodiment.

According to at least one of the disclosed embodiments, a transparent organic light emitting display may be realized by increasing an external light transmittance, and at the same time, a dual-emission image display may be realized.

In addition, a transparent organic light emitting display may prevent distortion of a transmission image by restraining scatter of the transmitting light.

While the disclosed embodiments have been particularly shown and described with reference to accompanying embodiments thereof, it will be understood by those of ordinary skill in the art that various changes in form and details may be made therein without departing from the spirit and scope of the following claims.

What is claimed is:

1. An organic light emitting display comprising:
    a substrate;
    a plurality of pixels formed on the substrate, wherein each of the pixels comprises i) a first light emission area, ii) a second light emission area iii) at least one transmission area transmitting external light, and iv) a pixel circuit unit;
    a first pixel electrode formed in the first light emission area and electrically connected to the pixel circuit unit, wherein the first pixel electrode comprises a first transparent conductive layer and a reflective layer;
    a second pixel electrode formed in the second light emission area and electrically connected to the first pixel electrode, wherein the second pixel electrode comprises a second transparent conductive layer;
    a first opposite electrode substantially facing the first pixel electrode;
    a second opposite electrode substantially facing the second pixel electrode;

an organic emission layer formed between the first pixel electrode and the first opposite electrode and between the second pixel electrode and the second opposite electrode; and a transmission window, wherein the transmission window is not overlapped with the second pixel electrode and the second opposite electrode.

2. The organic light emitting display of claim 1, wherein at least part of the second light emission area overlaps with the transmission area.

3. The organic light emitting display of claim 1, wherein the first and second pixel electrodes are connected to each other.

4. The organic light emitting display of claim 1, wherein at least one of the first and second transparent conductive layers is formed of at least one metal oxide selected from the group consisting of indium tin oxide (ITO), indium zinc oxide (IZO), ZnO, and $In_2O_3$.

5. The organic light emitting display of claim 1, wherein the second pixel electrode is partially transmissive and partially reflective.

6. The organic light emitting display of claim 1, wherein the reflective layer of the first pixel electrode comprises at least one metal material selected from the group consisting of Ag, Mg, Al, Pt, Pd, Au, Ni, Nd, Ir, Cr, Li, Ca, Yb, and an alloy thereof.

7. The organic light emitting display of claim 1, wherein the first and second opposite electrodes are integrally formed with each other.

8. The organic light emitting display of claim 1, wherein the first opposite electrode is at least partially transmissive.

9. The organic light emitting display of claim 1, wherein the second opposite electrode is at least partially reflective.

10. The organic light emitting display of claim 1, wherein at least one of the first and second opposite electrodes comprises at least one metal selected from the group consisting of Ag, Mg, Al, Pt, Pd, Au, Ni, Nd, Ir, Cr, Li, Ca, Yb, and an alloy thereof.

11. An organic light emitting display comprising:

a substrate;

a plurality of pixels formed on the substrate, wherein each of the pixels comprises i) a first light emission area, ii) a second light emission area, iii) a light transmission area and iv) at least one circuit element which is formed substantially directly below or above the first light emission area and is not formed in the light transmission area, and wherein the second light emission area at least partially overlaps with the light transmission area;

a first pixel electrode formed on the first light emission area and electrically connected to the circuit element, wherein the first pixel electrode is at least partially reflective;

a second pixel electrode formed on the second light emission area and electrically connected to the first pixel electrode, wherein the second pixel electrode is at least partially transmissive;

an organic light emitting layer contacting and formed over the first and second pixel electrodes;

a first opposite electrode formed over the organic light emitting layer and facing the first pixel electrode;

a second opposite electrode formed over the organic light emitting layer and facing the second pixel electrode; and a transmission window, wherein the transmission window is not overlapped with the second pixel electrode and the second opposite electrode.

12. The organic light emitting display of claim 1, wherein the first pixel electrode further comprises an additional transparent conductive layer on top of the reflective layer.

13. The organic light emitting display of claim 1, wherein the second transparent conductive layer is not a part of the first transparent conductive layer.

14. The organic light emitting display of claim 11, wherein the light transmission area is configured to transmit external light.

* * * * *